(12) United States Patent
Kim et al.

(10) Patent No.: US 12,433,118 B2
(45) Date of Patent: Sep. 30, 2025

(54) ORGANIC LIGHT-EMITTING DISPLAY DEVICE INCLUDING CONDUCTIVE LINES HAVING INCLINED SURFACE

(71) Applicant: LG DISPLAY CO., LTD., Seoul (KR)

(72) Inventors: Moungo Kim, Paju-si (KR); Yusok Lim, Paju-si (KR); Taehoon Lee, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/237,711

(22) Filed: Aug. 24, 2023

(65) Prior Publication Data

US 2023/0403896 A1    Dec. 14, 2023

Related U.S. Application Data

(63) Continuation of application No. 17/130,410, filed on Dec. 22, 2020, now Pat. No. 11,765,949.

(30) Foreign Application Priority Data

Dec. 24, 2019 (KR) .................. 10-2019-0174378

(51) Int. Cl.
*H10K 59/131* (2023.01)
*H10K 50/84* (2023.01)
*H10K 59/80* (2023.01)

(52) U.S. Cl.
CPC .......... *H10K 59/131* (2023.02); *H10K 50/84* (2023.02); *H10K 59/873* (2023.02)

(58) Field of Classification Search
CPC ............. H10K 59/131; H10K 50/84

USPC ............................................. 257/40
See application file for complete search history.

(56) References Cited

U.S. PATENT DOCUMENTS

| 2008/0197193 | A1  | 8/2008  | Overhultz et al. |
| 2015/0228927 | A1* | 8/2015  | Kim .............. H10K 50/805 257/40 |
| 2017/0256599 | A1  | 9/2017  | Kim et al. |
| 2017/0352717 | A1* | 12/2017 | Choi ............. H10K 59/131 |

(Continued)

FOREIGN PATENT DOCUMENTS

| CN | 107464818 A | 12/2017 |
| CN | 107546242 A | 1/2018 |

(Continued)

OTHER PUBLICATIONS

Extended European Search Report dated May 25, 2021 issued in European Patent Application No. 20213731.1 (9 pages).

(Continued)

*Primary Examiner* — Xia L Cross
(74) *Attorney, Agent, or Firm* — Fish & Richardson P.C.

(57) ABSTRACT

An organic light-emitting display device includes a board that has an active area and an inactive area in the vicinity of the active area, a dielectric layer is disposed over the board, a pad into which a signal or power is input is disposed in the inactive area a conductive line which is disposed on the dielectric layer and is connected to the pad and along which power is thus transferred to the active area, a bump pattern is disposed underneath the dielectric layer, and the bump pattern includes a positive taper that is inclined toward the direction of the conductive line. Both sides of the conductive line include an inclined surface.

17 Claims, 10 Drawing Sheets

(56) References Cited

U.S. PATENT DOCUMENTS

| | | |
|---|---|---|
| 2017/0373028 A1 | 12/2017 | Ryu et al. |
| 2018/0006104 A1 | 1/2018 | Jung et al. |
| 2018/0020563 A1 | 1/2018 | Hong et al. |
| 2018/0061918 A1 | 3/2018 | Park et al. |
| 2018/0175131 A1 | 6/2018 | Lee |
| 2018/0226612 A1 | 8/2018 | Choi et al. |
| 2019/0181373 A1* | 6/2019 | Kim .................... H10K 59/122 |
| 2019/0267444 A1 | 8/2019 | Moon et al. |
| 2019/0296098 A1 | 9/2019 | Cheng et al. |

FOREIGN PATENT DOCUMENTS

| | | |
|---|---|---|
| CN | 107561796 A | 1/2018 |
| CN | 110197840 A | 9/2019 |
| CN | 110491902 A | 11/2019 |
| KR | 20180091987 A | 8/2017 |

OTHER PUBLICATIONS

Chinese Office Action dated Dec. 20, 2023 issued in Patent Application No. 202011437091.7 w/English Translation (12 pages).
Extended European Search Report dated May 31, 2024 issued in EP application No. 24158559.5 (9 pages).
Extended European Search Report in European Appln. No. 24208330.1, mailed on Feb. 12, 2025, 13 pages.
Office Action in Korean Appln. No. 10-2019-0174378, mailed on Mar. 21, 2025, 9 pages (with English translation).

* cited by examiner

ORGANIC LIGHT-EMITTING DISPLAY DEVICE INCLUDING CONDUCTIVE LINES HAVING INCLINED SURFACE

CROSS-REFERENCE TO RELATED APPLICATIONS

This application is a continuation of U.S. patent application Ser. No. 17/130,410, filed on Dec. 22, 2020, which claims the priority benefit of Korean Patent Application No. 10-2019-0174378, filed on Dec. 24, 2019, the entire contents of which is incorporated herein by reference for all purposes as if fully set forth herein.

BACKGROUND

Field of the Disclosure

The present disclosure relates to an organic light-emitting display device and, more particularly, to an organic light-emitting display device capable of blocking moisture from permeating along a power wiring line in the organic light-emitting display device.

Description of the Background

Organic light-emitting diodes (OLEDs) used in organic light-emitting display devices are self-emissive elements. The organic light-emitting diode (OLED) includes an emissive electroluminescent layer situated between two electrodes. In the organic light-emitting diode, electrons and holes are injected into the emissive electroluminescent layer from the electron injection electrode (i.e., cathode) and the hole injection electrode (i.e., anode), respectively, and combine there to produce excitons. When the excitons transit from the excited state to the ground state, light is emitted.

In the organic light-emitting display device, a display panel is formed using the organic light-emitting elements. According to a direction in which light is emitted, the display panel may be realized as a top-emission type, a bottom-emission type, and a dual-emission type. According to a drive scheme, the display panel may be realized as a passive matrix type and an active matrix type. The organic light-emitting display device is so flexible that it can be realized in such various forms as a form of having a curved surface and an artificially or mechanically bent form.

The organic light-emitting display device may be manufactured using a flexible display panel as a base panel. Thus, it is possible that the organic light-emitting display device is realized in such various forms as an artificially or mechanically bent form or a form of having a curved surface.

The organic light-emitting display device with the features as described above has a very wide range of applications. However, in a case where water permeation occurs in an organic light-emitting display device in the related art, due to its structural features, water permeates into an active area in the organic light-emitting display device. Thus, the lifetime thereof decreases, or a defect in image quality, such as a black spot, can occur. To prevent this, water is blocked in various ways from permeating and/or penetrating. Particularly, for application, a study has been made on various structures for blocking water from permeating and diffusing into an outer portion.

The above information disclosed in this Background section is only for enhancement of understanding of the background of the described technology and therefore it may contain information that does not form prior art that is already known in this country to a person of ordinary skill in the art.

SUMMARY

Accordingly, the present disclosure is to delay the time it takes for water to permeate along an edge of a conductive line and to decrease the likelihood that damage to the conductive line will occur. As a result, the lifetime and reliability of an active area are improved, the likelihood that a defective in image quality will occur is decreased, and a sealing feature of a protective layer is improved.

Problems that the present disclosure purports to solve are not limited to the problem described above, and from the following description, other problems that are not described above will be clearly understood by a person of ordinary skill in the art.

According to an aspect of the present disclosure, there is provided an organic light-emitting display device including a board that has an active area and an inactive area in the vicinity of the active area. A dielectric layer is disposed over a board. A pad into which a signal or power is input is disposed in the inactive area. A conductive line which is disposed on the dielectric layer and is connected to the pad and along which power is thus transferred to the active area is formed. A bump pattern is disposed underneath the dielectric layer. The bump pattern includes a positive taper that is inclined toward the direction of the conductive line. Both sides of the conductive line include an inclined surface.

According to an aspect of the present disclosure, an organic light-emitting display device that is capable of delaying the time it takes for water to permeate along an edge of a line and additionally decreasing the likelihood that damage to the line will occur is provided. This provides advantages of improving the lifetime and reliability of an active area, decreasing the likelihood that a defective in image quality will occur, and improving a sealing feature of a protective layer. In addition, according to another aspect of the present disclosure, an organic light-emitting display apparatus that is capable of improving step coverage when forming a protective film layer is provided. This provides an advantage of improving a sealing feature of the protective film layer.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
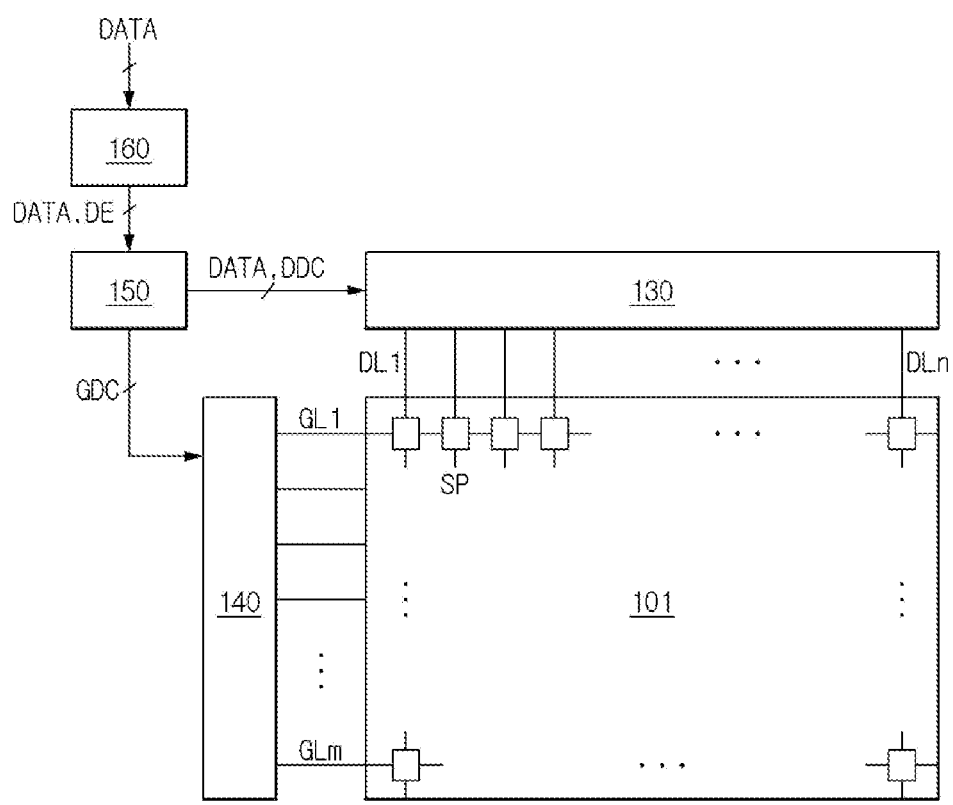
FIG. 1 is a schematic block diagram illustrating an organic light-emitting display device.

Advantages and features of the present disclosure, and methods of achieving the advantages and the features will be apparent from the accompanying drawings and from aspects that will be described in detail below. However, the present disclosure is not limited to the aspects that will be disclosed below, and various different aspects thereof can be implemented. The aspects are only provided to make a complete disclosure of the present disclosure and to provide full notice of the scope of the disclosure to a person of ordinary skill in the art to which the present disclosure pertains. The scope of the present disclosure should be only defined by claims.

Shapes, sizes, scales, angles, quantities, and the likes that are illustrated in the drawings for description of the present disclosure are only given as examples and thus do not impose any limitation to the present disclosure. The same reference character throughout the specification refers to the same constituent element. In addition, when the present disclosure is described, in a case where it is determined that detailed descriptions of functions and configurations known in the related art will unnecessarily make the nature and gist of the present disclosure unapparent, detailed descriptions thereof are omitted. The terms "include", "have", "is configured with", and the like, which are used in the present specification, as long as the modifier "only" is not used, one or more other components may be added. In a case where a constituent element is used as a singular form, unless otherwise described in a particularly explicit manner, the general rule that the singular includes the plural applies.

Unless otherwise explicitly described, when a constituent element is interpreted, a range of errors allowable for the constituent element is taken into consideration.

For example, when the terms "above", "over", "below", "under", "underneath", "adjacent to", and the like are used to describe a positional relationship between two constituent elements, one or more other constituent elements may be positioned between the two constituent elements.

For example, when the term "on" is used, two different elements or layers are in contact with each other without one or more other elements or layers in between.

Although used to describe various constituent elements, the terms first, second, and so on do not impose any limitation on the terms. The terms are used to distinguish one constituent component from one or more other constituent components. Therefore, a first constituent element that will be described below may be a second constituent element that falls within the scope of the technological idea of the present disclosure.

The same reference character throughout the specification refers to the same constituent element.

The size and thickness of each of the constituent elements that are illustrated in the drawings are given for convenient description, and the present disclosure is not necessarily limited to the size and thickness.

Features of various aspects of the present disclosure may be integrated or combined severally or as a whole. It is sufficiently understood by a person of ordinary skill that various interworking operations or driving operations are technically possible. The aspects may be implemented independent of each other or may be implemented in conjunction with each other.

The aspects of the present disclosure will be described in detail below with referring to the accompanying drawings.

Figure 2:
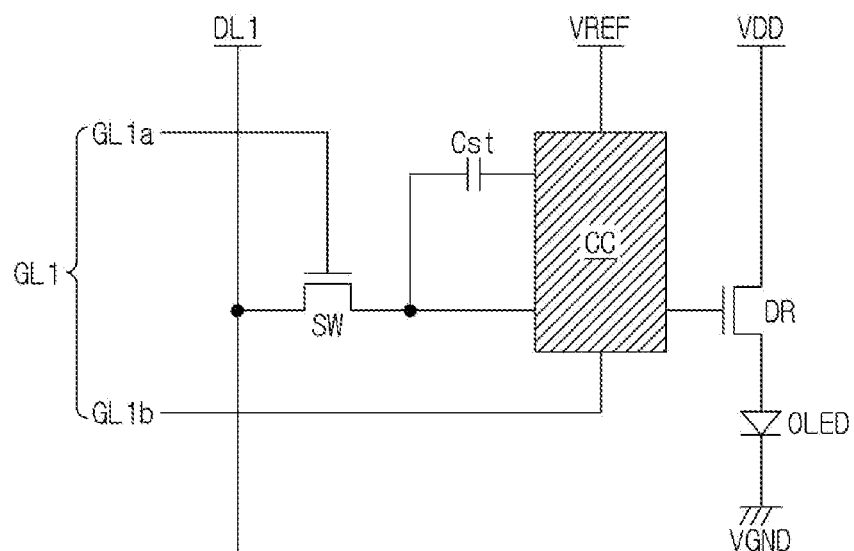
FIG. 2 is a schematic diagram illustrating a configuration of a sub-pixel circuit.
Figure 3:
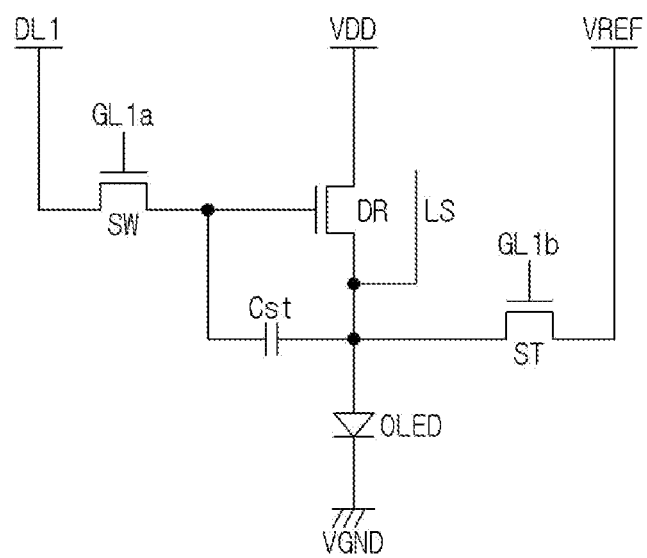
FIG. 3 is a diagram schematically illustrating a configuration of a circuit for a sub-pixel according to an aspect of the present disclosure.

FIG. 1 is a schematic block diagram illustrating an organic light-emitting display device. FIG. 2 is a schematic diagram illustrating a configuration of a sub-pixel circuit. FIG. 3 is a diagram illustrating a configuration of a circuit for a sub-pixel according to an aspect of the present disclosure.

As illustrated in FIG. 1, the organic light-emitting display device includes an image processing unit 160, a timing control unit 150, a data drive unit 130, a gate drive unit 140, and a display panel 101.

The image processing unit 160 outputs a data enable signal DE and the like, along with a data signal DATA supplied from the outside. In addition to the data enable signal DE, the image processing unit 160 may output one or more of a vertical synchronization signal, a horizontal synchronization signal, and a clock signal. Illustrations of these signals are omitted for convenient description. The image processing unit 160 is manufactured in the form of an integrated circuit (IC) on a system circuit board.

The timing control unit 150 receives the data signal DATA from the image processing unit 160, along with the data enable signal DE, or drive signals that include the vertical synchronization signal, the horizontal synchronization signal, the clock signal, and the like.

The timing control unit 150 outputs a gate timing control signal GDC for controlling operation timing of the gate drive unit 140 and a data timing control signal DDC for controlling operation timing of the data drive unit 130, on the basis of the drive signals. The timing control unit 150 is manufactured in the form of an IC on a control circuit board.

The data drive unit 130 samples and latches the data signal DATA that is supplied from the timing control unit 150, in response to the data timing control signal DDC supplied from the timing control unit 150, converts the resulting data signal DATA into a gamma reference voltage, and outputs the gamma reference voltage. The data drive unit 130 outputs the data signal DATA through data lines DL1 to DLn. The data drive unit 130 is formed in the form of an IC on a data circuit board.

The gate drive unit 140 outputs a gate signal in response to the gate timing control signal GDC supplied from the timing control unit 150. The gate drive unit 140 outputs the gate signal through gate lines GL1 to GLm. The gate drive unit 140 is formed in the form of an IC on a gate circuit board or is formed on the display panel 101 using a gate-in-panel technique.

The display panel 101 displays an image in a manner that corresponds to the data signal DATA and the gate signal that are supplied from the data drive unit 130 and the gate drive unit 140, respectively. The display panel 101 includes sub-pixels SP for displaying an image.

The sub-pixel is formed according to a top-emission type, a bottom-emission type or a dual-emission type that is selected according to a structure thereof. The sub-pixels SP includes a red sub-pixel, a green sub-pixel, and a blue sub-pixel, or includes a white sub-pixel, a red sub-pixel, a green sub-pixel, and a blue sub-pixel. The sub-pixels SP may have one or more different light-emitting areas according to light-emitting features thereof.

As illustrated in FIG. 2, one sub-pixel includes a switching transistor SW, a drive transistor DR, a capacitor Cst, a compensation circuit CC, and an organic light-emitting diode OLED. The organic light-emitting diode (OLED) operates to emit light according to drive current generated by the drive transistor DR.

In response to a gate signal supplied through a first-a gate line GL1a, the switching transistor SW performs switching in such a manner that a data signal supplied from a first data line DL1 is stored, as a data voltage, in the capacitor Cst. According to the data voltage stored in the capacitor Cst, the drive transistor DR operates in such a manner that drive current flows between a high potential power line $V_{DD}$ and a low potential power line $V_{GND}$.

The compensation circuit CC is a circuit for compensating for a threshold voltage or the like of the drive transistor DR. The compensation circuit CC is configured with one or more thin film transistors and a capacitor. The compensation circuit has a configuration that varies from one compensation method to another. One example of the configuration thereof is described as follows.

As illustrated in FIG. 3, the compensation circuit CC includes a sensing transistor ST and a reference line VREF. The sensing transistor ST is connected between a source line of the drive transistor DR and an anode electrode (hereinafter referred to as a sensing node) of the organic light-emitting diode (OLED). The sensing transistor ST operates in such a manner that an initialization voltage (or a sensing voltage) transferred through the reference line VREF is supplied to the sensing node or that a voltage or current of the sensing node is sensed.

A gate electrode of the switching transistor SW is connected to the first-a gate line GL1a, a first electrode thereof is connected to the first data line DL1, and a second electrode is connected to a gate electrode of the drive transistor DR. The gate electrode of the drive transistor DR is connected to a second electrode of the switching transistor SW, a first electrode thereof is connected to a first power line EVDD, and a second electrode thereof is connected to an anode electrode of the organic light-emitting diode OLED. A first electrode of the capacitor Cst is connected to the gate electrode of the drive transistor DR, and a second electrode thereof is connected to the anode electrode of the organic light-emitting diode OLED. The anode electrode of the organic light-emitting diode OLED is connected to a second electrode of the drive transistor DR, and a cathode electrode thereof is connected to a second power line EVSS. A gate electrode of the sensing transistor ST is connected to a first-b gate line GL1b, a first electrode thereof is connected to the reference line VREF, and a second electrode thereof is connected to the second electrode of the drive transistor DR that is the sensing node, and the anode electrode of the organic light-emitting diode OLED.

As an example, the sensing transistor ST may operate at the same time as, or earlier or later than the switching transistor SW, according to a compensation algorithm (or a configuration of a compensation circuit). The reference line VREF may be connected to the data drive unit 130. In this case, during an image non-display period, or during a period of N frames (N is an integer that is equal to or greater than 1), the data drive unit 130 can sense the sensing node of the sub-pixel, in real time, and can generate a result of the sensing.

In addition, according to the result of the sensing, a digital-type data signal, an analog-type data signal, a gamma, or the like may be subject to compensation. Then, the compensation circuit that generates a compensation signal (or a compensation voltage) on the basis of the result of the sensing may be realized as an internal circuit of the data drive unit or an internal or separate circuit of the timing control unit.

A light blocking layer LS may be disposed only underneath a channel region of the drive transistor DR. Alternatively, the light blocking layer LS may be disposed not only underneath the channel region of the drive transistor DR, but also underneath the respective channel regions of the switching transistor SW and the sensing transistor ST. The light blocking layer LS may be used for the purpose of simply blocking external light. Alternatively, the light blocking layer LS may be utilized as an electrode that serves to make a connection to a different electrode or line and that makes up a capacitor or the like.

In addition, as an example, the sub-pixel that has a 3-transistor (T) 1-capacitor (C) structure in which the switching transistor SW, the drive transistor DR, the capacitor Cst, the organic light-emitting diode (OLED), and the sensing transistor ST are included is described with reference to FIG. 3. However, in a case where the compensation circuit (CC) is added, the sub-pixel may be configured to have one other structure, such as a 3T2C, 4T2C, 5T1C, or 6T2C structure.

In addition, thin film transistors, such as the switching transistor SW, the drive transistor DR, and the sensing transistor ST, may be realized using a low-temperature polysilicon (LTPS), amorphous silicon (a-Si), oxide, or organic semiconductor layer as a base layer.

Figure 4:
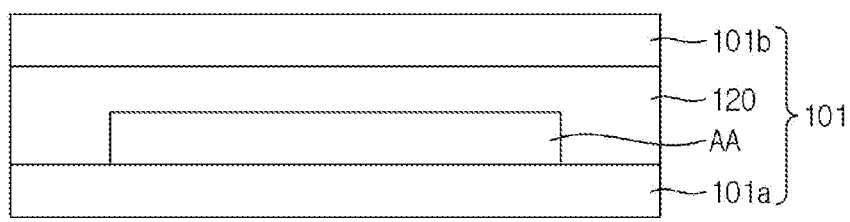
FIG. 4 is a diagram schematically illustrating a cross section of a display panel.
Figure 5:
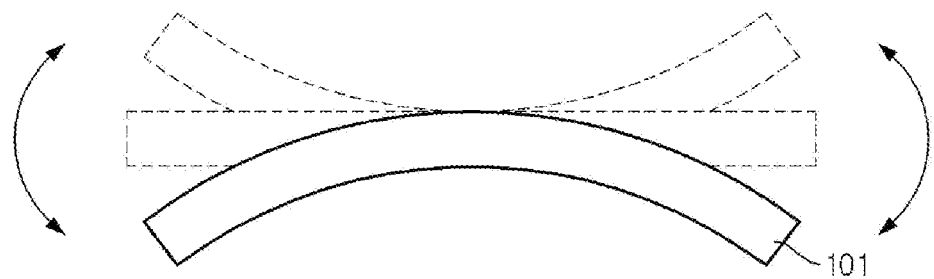
FIG. 5 is a diagram illustrating a mechanical feature of the display panel that is illustrated in FIG. 4.
Figure 6:
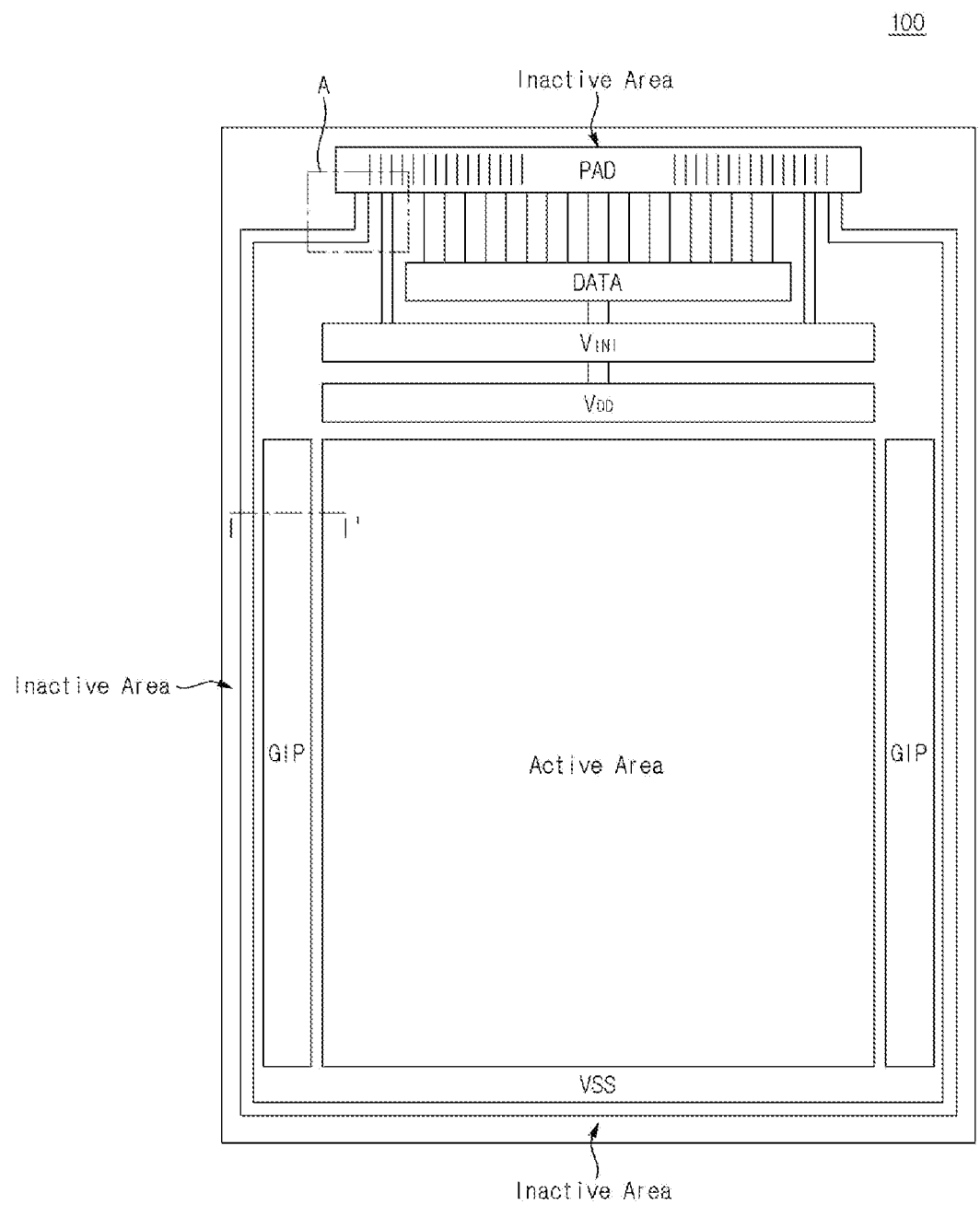
FIG. 6 is a diagram illustrating a display device that is to be included in an electronic apparatus.
Figure 7:
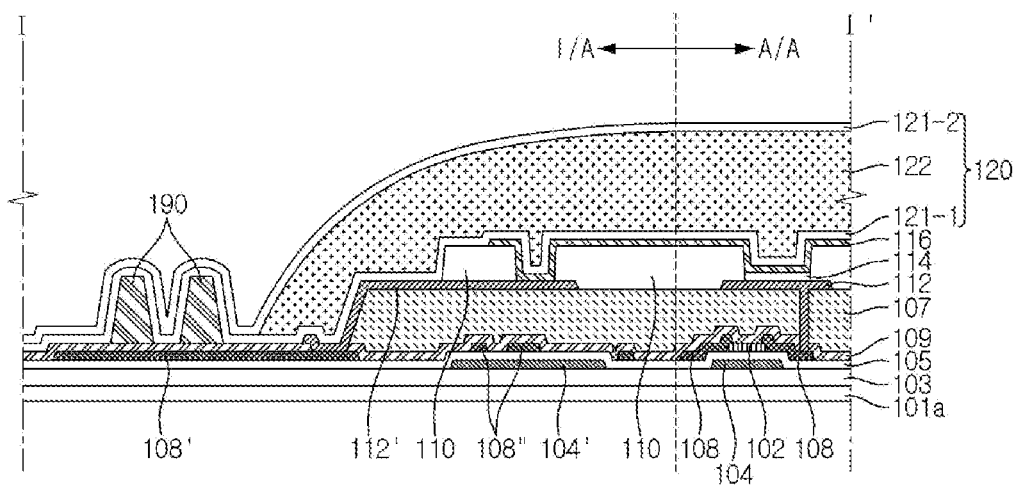
FIG. 7 is a diagram schematically illustrating an active area or an inactive area of a display device according to an aspect of the present disclosure.

FIG. 4 is a diagram illustrating a cross section of the display panel. FIG. 5 is a diagram illustrating a mechanical feature of the display panel that is illustrated in FIG. 4. FIG. 6 is a top-view diagram illustrating the display panel. FIG. 7 is a diagram illustrating a cross section of the display panel on a per-pixel basis.

As illustrated in FIG. 4, the display panel 101 includes a first board 101a, an active area A/A, a protective film layer 120, and a second board 101b. The first board 101a and the second board 101b are each formed of one selected from among plastics, such as polyimide (PI), polyethersulfone (PES), polyethylene terephthalate (PET), polycarbonates (PC), polyethylene, polyethylene naphthalate (PEN), and acrylonitrile butadiene styrene (ABS).

The active area A/A is formed between the first board 101a and the second board 101b. Sub-pixels and various signal lines and power lines are formed in the active area A/A. The sub-pixels, the various signal lines, and power lines that are positioned in the active area A/A are formed using a thin film process.

Structures, such as the sub-pixels, the various signal lines, and power lines that are formed in the active area A/A, are subject to water (moisture) or oxygen. For this reason, the active area A/A is protected by the protective film layer 120. The protective film layer 120 may be configured to be single-layered or multi-layered. Alternatively, the protective film layer 120 may be formed by alternately stacking an organic layer and an inorganic layer on top of each other. According to an interlayer structure of the protective film layer 120, the second board 101b may be omitted.

The organic light-emitting display device that is manufactured using the above-described display panel 101 as a base panel is realized as the top-emission type, the bottom-emission type or the dual-emission type.

As illustrated in FIG. 5, the display panel 101 described above may have the property of flexibility. Therefore, the organic light-emitting display device that is manufactured using the flexible display panel 150 as a base panel is realized in such various forms as the artificially or mechanically bent form and the form of having a curved surface.

FIG. 6 is a diagram illustrating an exemplary display device that is possibly included in an electronic apparatus.

With reference to FIG. 6, a display device 100 includes at least one active area, and an array of pixels is formed in the active area. One or more inactive areas may be disposed in the vicinity of the active area A/A. That is, the inactive area I/A may be adjacent to one or more flank surfaces of the active area A/A. In FIG. 6, the inactive area FA surrounds the active area A/A in the form of a rectangle. However, a shape of the active area A/A and a shape and/or disposing of the inactive area I/A adjacent to the active area A/A are not limited to an example that is illustrated in FIG. 6. The respective shapes of the active area A/A and the inactive area FA may be suitable for a design of an electronic apparatus equipped with the display device 100. Exemplary shapes of the active area A/A include a pentagon, a hexagon, a circle, an ellipse, and so on.

Each pixel within the active area A/A may be associated with a pixel circuit. The pixel circuit may include one or more switching transistors and one or more drive transistors on a backplane. Each pixel circuit may be electrically connected to a gate line and a data line in order to communicate with one or more drive circuits such as a gate driver and a data driver that are positioned in the inactive area I/A.

The drive circuit, as illustrated in FIG. 6, may be realized as a thing film transistor (TFT) in the inactive area I/A. This drive circuit may be referred to as a gate-in-panel (GIP). In addition, several components, such as a data driver IC, may be mounted on a separated printed circuit board and be combined with a connection interface (a PAD, a bump, a pin, or the like) that is disposed in the inactive area I/A, using a circuit film, such as a flexible printed circuit board (FPCB), a chip-on-film (COF), or a tape-carrier-package (TCP). The inactive area I/A may be raised or lowered along with the connection interface, and thus a printed circuit (a COF, a PCB, or the like) may be positioned behind the display device 100.

The display device 100 may further include various additional elements for generating various signals or driving a pixel in the active area A/A. The additional element for driving a pixel may be an inverter circuit, a multiplexer, an electrostatic discharge circuit or the like. The display device 100 may also include an additional element associated with a function other than pixel driving. For example, the display device 100 may include additional elements that provide a touch sensing function, a user authentication function (for example, fingerprint recognition), a multi-level pressure sensing function, a tactile feedback function, and the like. The additional elements mentioned above may be positioned in an external circuit that is connected to the inactive area I/A and/or the connection interface.

One or more edges of the display device 100 may be raised or lowered in such a manner as to be positioned at a remote distance away from the central portion. One or more portions of the display device 100 may be raised or lowered. Therefore, the display device 100 may be defined as having a substantially flat portion and a raised or lowered portion. That is, one portion (for example, a wiring portion between the PAD and the active area A/A) of the display device 100 may be raised or lowered at a predetermined angle. The one portion may be referred to as the raised or lowered portion. The raised or lowered portion includes a curvature section that is actually curved with a predetermined curve radius. Although this is not always true, the central portion of the display device 100 may be substantially flat, and an edge portion thereof may be the raised or lowered portion.

When the inactive area I/A is raised or lowered, the inactive area I/A is not seen from a front surface of the display device, or a minimum-sized portion thereof is seen from the front surface thereof. One portion of the inactive area I/A, which is seen from the front surface of the display device, may be covered with a bezel. The bezel may be formed as an independent structure, a housing, or one other suitable element. One portion of the inactive area I/A, which is seen from the front surface of the display device, may be hidden underneath an opaque mask layer, such as black ink (for example, polymer filled with carbon black). This opaque mask layer may be provided on various layers (a touch sense layer, a polarization layer, a cover layer, and the like) that are included in the display device 100.

The raised or lowered portion has a curvature angle of □ with respect to a curvature axis and a curvature radius of R and is raised or lowered in the direction from the center portion to the outside. The raised or lowered portions do not need to have the same size. In addition, the curvature angle of θ with respect to the curvature axis and the curvature radius of R from the curvature axis vary from one raised or lowered portion to another.

FIG. 7 is a cross-sectional diagram schematically illustrating the active area A/A and the inactive area I/A of the display device according to an aspect of the present disclosure.

The active area A/A and the inactive area I/A that are illustrated in FIG. 7 may be partially matched with the active area A/A and the inactive area I/A, respectively, that are described with reference to FIG. 6. As an example of the organic light-emitting display device, the display device will be described below.

In the case of the organic light-emitting display device, thin film transistors 102, 104, and 108, organic light-emitting elements 112, 114, and 116, and various functional layers are positioned on a base layer 101 in the active area A/A. On the other hand, various drive circuits (for example, a GIP), an electrode, a wiring line, a functional structure, and the like may be positioned on the base layer 101 in the inactive area I/A.

The base layer 101 supports various constituent elements of an organic light-emitting display device 100. The base layer 101 may be formed of a dielectric material, such as for example glass or plastic. A board (an array board) is also conceptually defined as including elements and functional layers, for example, a switching TFT, a drive TFT, an organic light-emitting element, a protective film, and the like, which are formed on the base layer 101.

A buffer layer 103 may be positioned on a base layer 101a. The buffer layer 103 is a functional layer for protecting a thin film transistor (TFT) from impurities, such as alkali ions flowing out of the base layer 101a or layers below. The buffer layer 103 may be formed of silicon oxide (SiOx) or silicon nitride (SiNx). The buffer layer 103 may be multi-layers formed of these materials. The buffer layer 103 may include a multi-buffer and/or an active buffer.

The thin film transistor is deposited on the base layer 101a or the buffer layer 103. The thin film transistor may be formed by sequentially stacking a semiconductor layer (active layer), a gate dielectric layer (gate insulator), a gate electrode, an interlayer dielectric layer (ILD), and source and drain electrodes on top of each other. Otherwise, the thin film transistor, as illustrated in FIG. 7, may be formed by sequentially depositing a gate electrode 104, a gate dielectric layer 105, a semiconductor layer 102, and source and drain electrodes 108.

The semiconductor layer 102 may be formed of polysilicon (p-Si). In this case, impurities may be doped into a predetermined region. In addition, the semiconductor layer 102 may be formed of amorphous silicon (a-Si) and be formed of one of various organic semiconductor materials, such as pentacene. Furthermore, the semiconductor layer 102 may be formed of oxide.

The gate electrode 104 may be formed of one of various conductive materials, for example, magnesium (Mg), aluminum (Al), nickel (Ni), chromium (Cr), molybdenum (Mo), tungsten (W), gold (Au), an alloy of these materials, or the like.

The gate dielectric layer 105 and the interlayer dielectric layer (ILD) may be formed of a dielectric material, such as silicon oxide (SiOx) or silicon nitride (SiNx), and additionally, may be formed of a dielectric organic material or the like. A contact hole through which a source and drain region is exposed may be formed by selectively removing the gate dielectric layer 105 and the interlayer dielectric layer.

The source and drain electrodes 108 may be formed by depositing a single layer of or a multi-layer of an electrode material on the gate dielectric layer 105 or the interlayer dielectric layer (ILD). If necessary, a passivation layer 109 formed of an inorganic dielectric material may cover the source and drain electrodes 108.

A flattening layer 107 may be positioned on the thin film transistor. The flattening layer 107 protects the thin film transistor and flattens an upper portion thereof. The flattening layer 107 may be configured to have various forms. Various modifications to the flattening layer 107 are possible. For example, the flattening layer 107 may be formed from an organic dielectric film, such as benzocyclobutene (BCB) or acrylic, or be formed from an inorganic dielectric film, such as a silicon nitride film (SiNx) or a silicon oxide film (SiOx). Furthermore, the flattening layer 107 may be configured to be single-layered and be double- or multi-layered.

An organic light-emitting element may be formed by sequentially depositing a first electrode 112, an organic light-emitting layer 114, and a second electrode 116 on top of each other. That is, the organic light-emitting element may be configured with the first electrode 112 formed on the flattening layer 107, the organic light-emitting layer 114 positioned on the first electrode 112, and the second electrode 116 on the organic light-emitting layer 114.

The first electrode 112 is electrically connected to the drain electrode 108 of the thin film transistor through the contact hole. In a case where the organic light-emitting display device 100 is the top-emission type, the first electrode 112 may be formed of an opaque conductive material having high reflectivity. For example, the first electrode 112 may be formed of silver (Ag), aluminum (Al), gold (Au), molybdenum (Mo), tungsten (W), chromium (Cr), an alloy of these materials, or the like. The first electrode 112 may be an anode of an organic light-emitting diode.

A bank 110 is formed in an area other than a light-emitting area. Accordingly, the bank 110 has a bank hole through which the first electrode 112 corresponding to the light-emitting area is exposed. The bank 110 may be formed of an inorganic dielectric material, such as silicon nitride film (SiNx) or a silicon oxide film (SiOx), or be formed of an organic dielectric material, such as BCB, acrylic-based resin, or imide-based resin.

The organic light-emitting layer 114 is positioned on the first electrode 112 exposed through the bank 110. The organic light-emitting layer 114 may include a light-emitting layer, an electron injection layer, an electron transport layer, a hole transport layer, a hole injection layer, and the like. The organic light-emitting layer 114 may be configured to have a single light-emitting structure in which one light beam is emitted, and be configured to have a structure in which with multiple light-emitting layers, white light is emitted.

The second electrode 116 is positioned on the organic light-emitting layer 114. In a case where the organic light-emitting display device 100 is the top-emission type, the second electrode 116 is formed of a transparent conductive material, such as indium tin oxide (ITO) or indium zinc oxide (IZO). Thus, light generated in the organic light-emitting layer 114 is emitted to over the second electrode 116. The second electrode 116 may be a cathode of the organic light-emitting diode.

An encapsulation layer 120 is positioned on the second electrode 116. The encapsulation layer 120 blocks oxygen and water from permeating from the outside in order to prevent oxidation of a light-emitting material and an electrode material. When the organic light-emitting element is exposed to water or oxygen, a pixel shrinkage phenomenon in which the light-emitting area is reduced can appear, or a dark spot can occur in the light-emitting area. The encapsulation layer 120 may be formed from an inorganic film formed of glass, metal, aluminum oxide (AlOx) or silicon (Si)-based material, or may have a structure in which an inorganic film 121-1, an organic film 122, and an inorganic film 121-2 are alternately stacked on top of each other. In this case, the inorganic films 121-1 and 121-2 serve to block water or oxygen from permeating, and the organic film 122 serves to flatten the respective surfaces of the inorganic films 121-1 and 121-2. A path for water or oxygen flow is lengthened and becomes more complicated when the encapsulation layer is formed by depositing several thin film layers on top of each other than when the encapsulation layer is formed as a single layer. Thus, it is difficult for the water or the oxygen to permeate into the organic light-emitting element.

A barrier film may be positioned on the encapsulation layer 120 and thus may encapsulate the entire base layer 101. The barrier film may be a retardation film or an optically isotropic film. In this case, an adhesive layer 145 may be positioned between the film and the encapsulation layer 120. The adhesive layer bonds the encapsulation layer 120 and the barrier film together. The adhesive layer 145 may be a heat-curable or self-curing adhesive. For example, the adhesive layer 145 may be formed of a material such as barrier pressure sensitive adhesive (B-PSA).

A pixel circuit and a light-emitting element are not disposed in the inactive area I/A. However, a base layer 101 and an organic/inorganic layers 130, 105, 107, and 120 may be present in the inactive area I/A. In addition, for other purposes, materials that are used for configuring the active area A/A may be disposed in the inactive area I/A. For example, as a wiring line or an electrode, a metal 104' that is formed of the same material as a gate electrode of the TFT in the active area, or a metal 108' that is formed of the same material as a source/drain electrode may be disposed in the inactive area I/A. Furthermore, as a wiring line or an electrode, a metal 112' that is formed of the same material as one electrode (for example, an anode) of the organic light-emitting diode may be disposed in the inactive area I/A.

The base layer 101, the buffer layer 103, the gate dielectric layer 105, the flattening layer 107, and the like in the inactive area I/A are the same as those in the active area A/A, which are described above. The dam 190 is a structure for preventing the organic film 122 from entering too far into the inactive area I/A. Various circuits and electrodes/wiring lines that are disposed in the inactive area I/A may be formed from the gate metal 104' and/or the source/drain metal 108'. In this case, the gate metal 104' is formed of the same material as the gate electrode of the TFT, in the same process as the gate electrode thereof is formed. Furthermore, the source/drain metal 108' is formed of the same material as a source/drain electrode of the TFT, in the same process as the source/drain electrode thereof is formed.

For example, the source/drain metal may be used as a power (for example, a base power $V_{SS}$) wiring line 108'. In this case, the power wiring line 108' is connected to the metal layer 112', and a cathode 116 of the organic light-emitting diode receives power by being connected to the source/drain metal 108' and the meal layer 112'. The metal layer 112' may be brought into contact with the power wiring line 108', may extend over the outermost sidewall of the flattening layer 107, and may be brought into contact with the cathode 116 over the flattening layer 107. The metal layer 112' may be a metal layer that is formed of the same material as an anode 112 of the organic light-emitting diode, in the same process as the anode 112 thereof is formed.

Figure 8A:
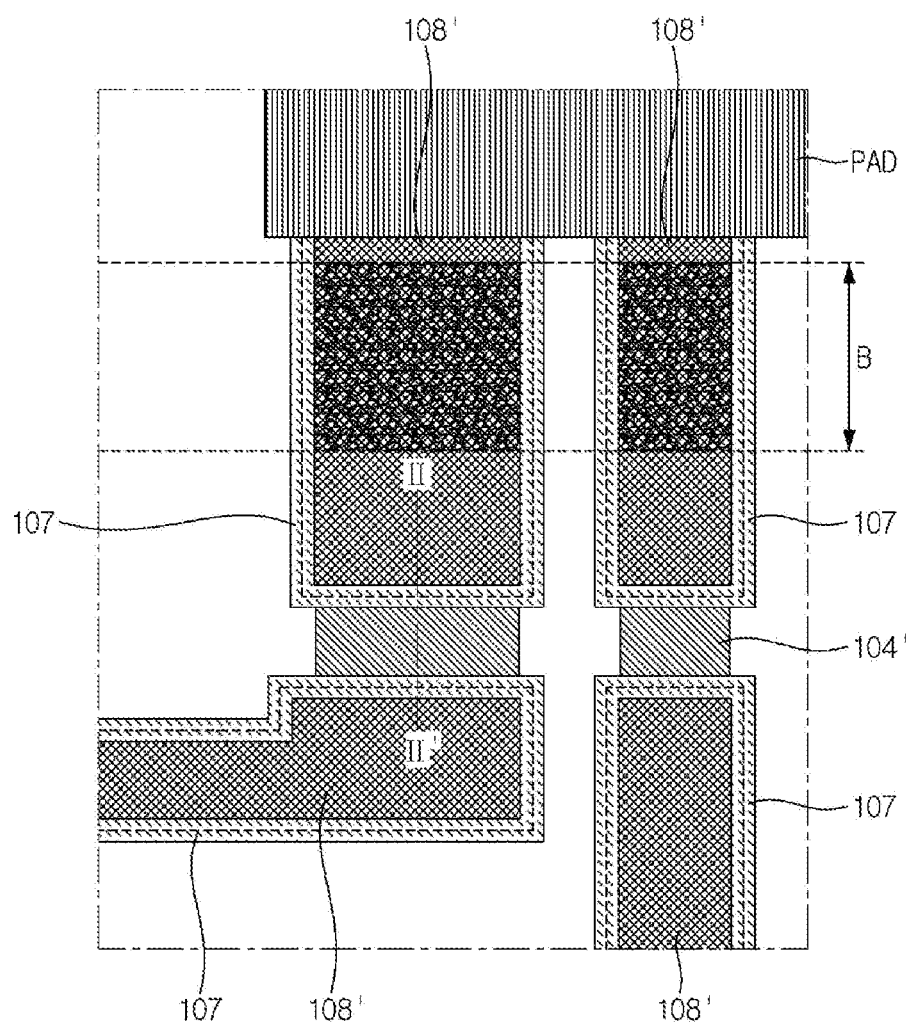
FIGS. 8A and 8B are diagrams each illustrating a structure of an outer portion of an organic light-emitting display device according to an aspect of the present disclosure.
Figure 8B:
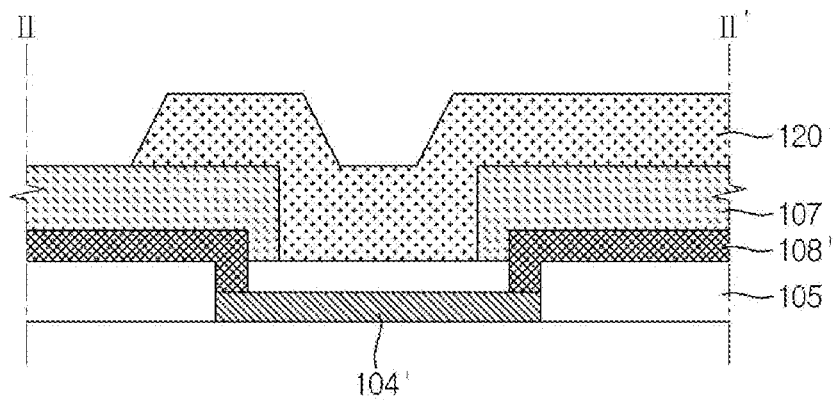

FIGS. 8A and 8B are diagrams each illustrating a structure of an outer portion of the organic light-emitting display device according to an aspect of the present disclosure.

FIG. 8A is an enlarged diagram illustrating an A area of FIG. 6. In FIG. 8A, only specific conductive lines are illustrated and other conductive lines (a data line, a gate signal line, and the like) are omitted. On the other hand, in FIG. 8A, a curvature section B that is possibly curved is illustrated. The curvature section is as described with reference to FIG. 6. On the other hand, the encapsulation layer 120 of which the structure is described with reference to FIG. 7 may cover one portion of the A area or the entire A area. In FIG. 8B, it is illustrated that the encapsulation layer 120 covers one portion of the A area.

The conductive line 108' extends from the connection interface PAD toward the direction of the active area. In this case, the conductive line 108' may be formed on a single layer. As illustrated, the respective conductors 108' and 104' on two layers may be connected.

The conductive line 108' may be a conductive line along which a low-level power $V_{SS}$ is transferred to the pixel circuit in the active area. In this case, the conductive line 108' may surround the entire active area. Alternatively, the conductive line 108' may be a conductive line along which a high- or low-level power $V_{DD}$ or an initialization power $V_{INI}$ is transferred to the pixel circuit in the active area A/A. In an example in FIG. 8A, a conductive line on the left side is a conductive line along which the low-level power $V_{SS}$ is transferred, and a conductive line on the right side is a conductive line along which the initialization power $V_{INI}$ is transferred.

The conductive line 108' may be formed of the same metal as the source or drain electrode of the thin film transistor TFT in the active area, in the same layer as the source or drain electrode thereof is formed. In this case, the conductive line 108' may be a multi-layered metal (which is referred to as Ti/Al/Ti) that results from stacking Ti, Al, and Ti in this order on top of each other. In FIG. 8B, it is illustrated that the gate dielectric layer 105 is positioned underneath the conductive line 108'. This is only one example of implementation. Other layers may be positioned underneath the conductive line 108'.

There is a concern that the conductive line 108' formed of titanium (Ti), aluminum (Al), and titanium (Ti) will be exposed to an etchant and thus will be etched during a subsequent process, for example, a process such as forming the anode of the organic light-emitting diode. This unnecessary etching can cause a defective conductive line (particularly, aluminum is more subject to etching than titanium). Because of this, a corner portion of the conductive line 108' is covered with an organic material layer 107. The organic material layer 107 suppresses a flank surface of the conductive line 108' from being damaged (etched) in the above-described process. In this case, for efficiency of manufacturing, the organic material layer 107 may be formed of the same material as a flattening layer on the thin film transistor TFT, in the same process as the flattening layer thereon is formed. The organic material layer 107 suppresses the flank surface of the conductive line from being damaged (etched). However, water may be diffused into the display device through the organic material layer 107. In order to prevent this phenomenon, as illustrated in FIG. 8B, the organic material layer 107 is cut into two parts, and two parts of the conductive line 108' can be connected through the conductors 104' underneath the two parts, respectively, of the connective line 108.

However, as the display device gradually decreases in size, the space that is to be occupied by the above-described structure decreases in size. The inventors recognized this problem and conceived a structure in which with a shape of the conductive line 108', water is prevented from being diffused.

Figure 9A:
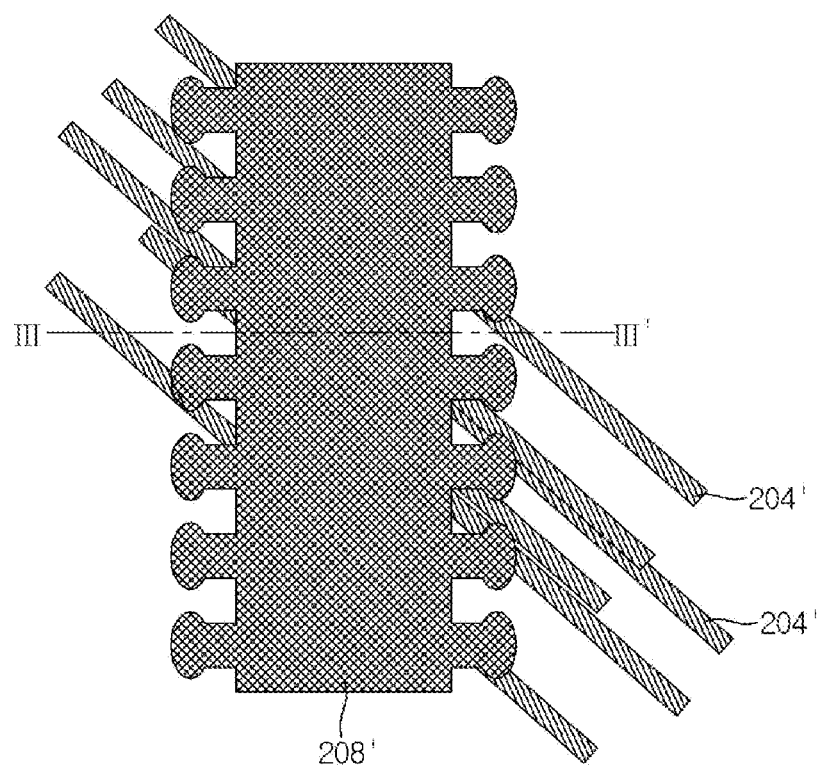
FIGS. 9A to 9C are diagrams each illustrating a structure of an outer portion of an organic light-emitting display device according to another aspect of the present disclosure.
Figure 9B:
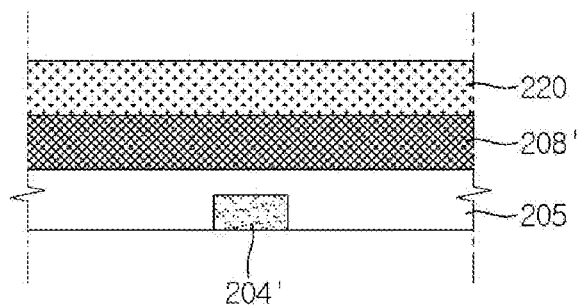
Figure 9C:
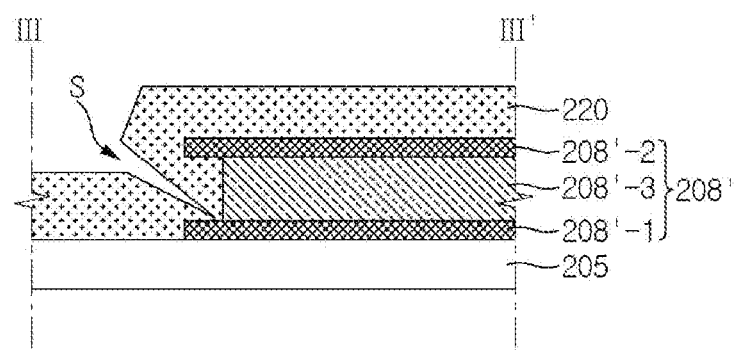

FIGS. 9A to 9C are diagrams each illustrating a structure of an outer portion of an organic light-emitting display device according to another aspect of the present disclosure.

The recent trend has been to maximize an active area and reduce an inactive area (bezel) according to a request for aesthetic design/functionality. In addition, an increase in resolution increases the number of various signal lines. Accordingly, as in FIGS. 9A and 9B, the respective numbers of conductive lines 204' and 208' that intersect increases. Conductive lines in each layer are insulated by a dielectric layer 205. As illustrated in FIG. 3, in terms of space, it is very difficult to connect metals in two layers using a jumping structure and thus to use the metals as one conductive line. That is, in each layer, an already-designed conductive line occupies most of the space. Thus, there is no area where a conductor for connecting upper or lower conductive lines is further disposed.

With reference to FIGS. 9A and 9B, both ends of the conductive line 208' are each configured to have an embossed structure or an uneven structure. Then, a structure in which an encapsulation layer 220 covers an upper portion of the conductive line 208' without depositing an organic material layer 207 on the conductive 208' is employed. Water permeates into the display device along an end of the conductive line 208'. When both ends of the conductive line 208' are formed to have the embossed structure or the uneven structure, a path for water permeation is lengthened. As a result, a phenomenon where water permeates into the display device can be delayed.

However, the disclosures found a problem with the above-described structure. FIG. 9C is a cross-sectional diagram taken along line in FIG. 9A. With reference to FIG. 9C, unlike in FIGS. 8A and 8B, the organic material layer 107 for protecting the conductive line does is not present on the conductive line 208' for conductive-line protection. Because of this, when performing a process of forming the anode of the organic light-emitting diode, the conductive line 208' is exposed to an anode etchant and thus is etched. As illustrated above, the conductive line 208' is configured to be formed from a triple layer of titanium (Ti), aluminum (Al), and titanium (Ti). In this case, due to a difference in an etching rate of the anode etchant, the aluminum Al positioned in the middle is etched much more, and thus an aluminum void is formed. This void is formed by upper and lower titanium (Ti) tips. Subsequently, when the encapsulation layer 220 is formed on an upper portion of the conductive line 108', due to the aluminum void, the encapsulation layer 220 does not completely cover a flank surface of the conductive line 208'. Thus, a recess S called a seam is formed in the encapsulation layer 220.

In this process, due to the recess S, damage occurs easily such as a crack, and a path along which a foreign material, such as water, permeates is created. The permeating water can cause corrosion of the conductive line or can cause a drive defect of the display device. Accordingly, the inventors recognized this problem and conceived a structure in which water diffusion is prevented with a structure of the conductive line 208'.

Figure 10A:
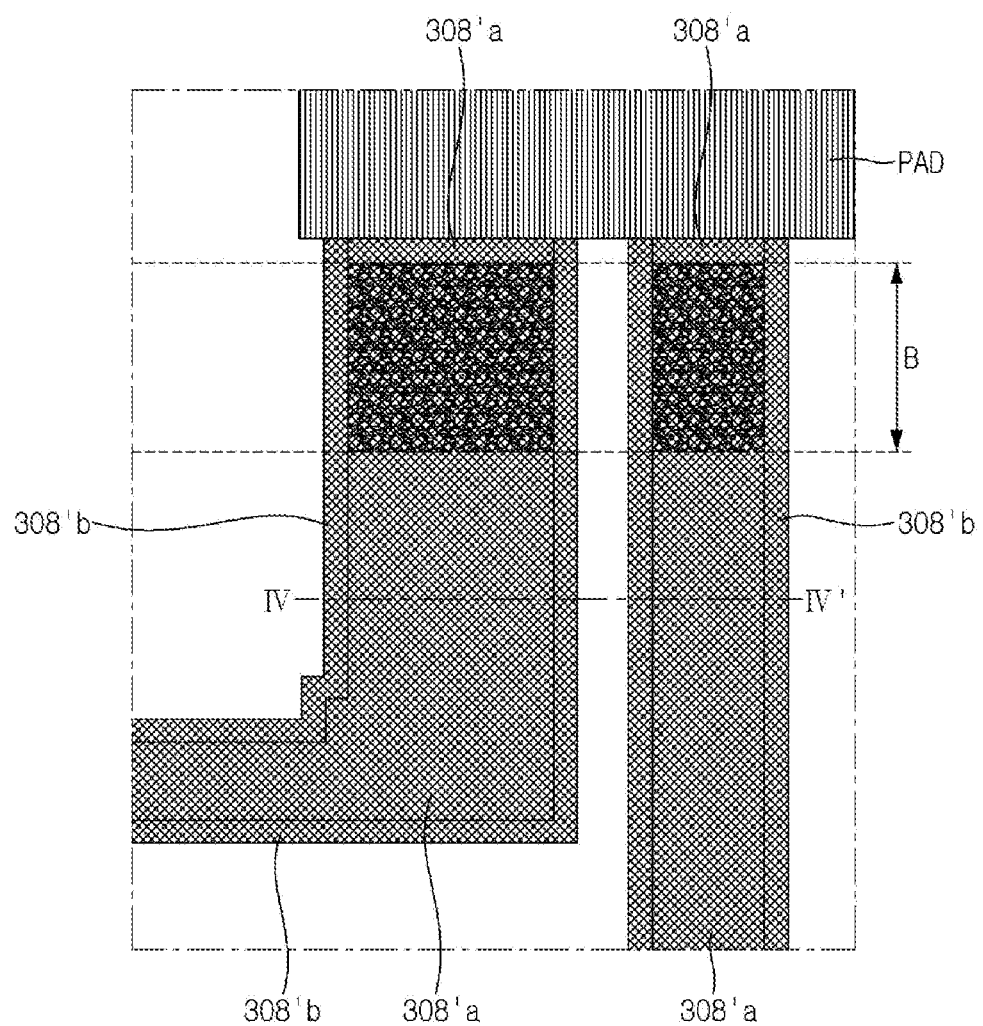
FIGS. 10A and 10B are diagrams each schematically illustrating a structure of an outer portion of an organic light-emitting display device according to still another aspect of the present disclosure.
Figure 10B:
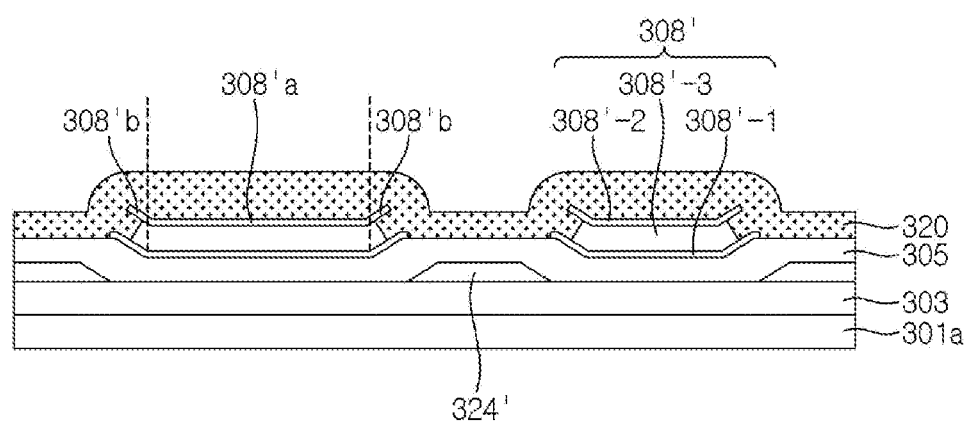

FIGS. 10A and 10B are diagrams each schematically illustrating a structure of an outer portion of an organic light emitting display device according to still another aspect of the present disclosure.

FIG. 10A is an enlarged diagram illustrating the A portion in FIG. 6. For convenient description, only specific conductive lines (for example, a power wiring line) are illustrated and other conductive lines (a gate line and a data line) are omitted. In addition, the conductive lines 308' are not all illustrated on a per-type basis. FIG. 10B is a cross-sectional diagram taken along line IV-IV' in FIG. 10A. In FIG. 10A, the curvature section B that is possibly curved is illustrated. On the other hand, an encapsulation layer 320 of which the structure is described with reference to FIG. 7 may cover one portion of the A area or the entire A area. In this case, the encapsulation layer 320 may cover up to only a lower portion of the curvature section B, and the encapsulation layer 320 may not be provided in the curvature section B in which there is a concern that damage will occur.

A board 301*a* may include the active area A/A and the inactive area I/A in the vicinity of the active area A/A. A dielectric layer 305 may be disposed over the board 301*a*. A pad into which a signal or power is input may be disposed in the inactive area I/A. A conductive line 308' which is disposed on the dielectric layer 305, which is connected to the PAD, and along which power is transferred to the active area A/A may be formed. A bump pattern 324 is disposed underneath the dielectric layer 305. The bump pattern 324 has a positive taper that is inclined toward the direction of the conductive line. Both sides of the conductive line may include an inclined surface.

The conductive line 308' may include a first portion 308'*a* and the respective second portions 308'*b* on both sides of the first portion 308'*a*. The more an end of the second portion 308'*b* is approached, the more a distance thereof from the board increases. That is, the dielectric layer 305 is present underneath the conductive line 308'. The bump pattern 324 is disposed underneath the dielectric layer 305 adjacent to the conductive line 308'. The dielectric layer 305 has different heights due to a portion where the bump pattern 324 is disposed and a portion where the bump pattern 324 is not disposed. Because the bump pattern 324 includes a positive taper that is inclined toward the direction of the conductive line 308', the dielectric layer 305 on the bump pattern 324 also has an inclined surface according to a shape of the positive taper of the bump pattern 324. With the inclination of the dielectric layer 305 due to the bump pattern 324, the more the second portion 308'*b* of the conductive line 308' approaches an end of the conductive line 308', the more a distance thereof from the board 301*a* increases. That is, the conductive line 308'*b* is bent at a predetermined angle toward the upward direction.

An angle of the tape of the bump pattern 324 is equal to or greater than 10° and is equal to or smaller than 60°. If the angle of the taper is smaller than 10°, the second portion 308'*b* of the conductive line 308' is not inclined sufficiently. Because of this, when the encapsulation layer 320 is disposed on the conductive line 308', a crack may occur in a flank surface of the conductive line 308'. Then, in a case where the angle of the taper of the bump pattern 324 exceeds 60°, there is a likelihood that the encapsulation layer 320 will be defective in coverage.

Both ends of the conductive line 308' may overlap with the taper of the bump pattern 324. In this case, the both ends of the conductive line 308' also have to face in the upward direction. When this is done, as described above, the seam can be prevented from occurring in the encapsulation layer 320.

The conductive line 308' may be configured with a lower layer 308'-1 brought into contact with the board 301*a*, an upper layer 308'-2 on the lower layer 308'-1, and an intermediate layer 308'-3 between the upper layer 308'-2 and the lower layer 308'-1. A width of the intermediate layer 308'-3 may be smaller than the respective widths of the upper layer 308'-2 and the lower layer 308'-1. In addition, the width of the upper layer 308'-2 may be greater than that of the intermediate layer 308'-3 and be smaller than that of the lower layer 308'-1.

The thin film transistor may be disposed in the active area A/A. The organic light-emitting element that is disposed on the thin film transistor and is electrically connected to the thin film transistor may be included. The encapsulation layer 320 that blocks water and/or oxygen from permeating from the outside may be formed on the organic light-emitting element.

The encapsulation layer 320 may be brought into contact with an entire flank surface of the lower layer 308'-1 of the conductive line 308' and one portion of an upper surface thereof. In addition, the encapsulation layer 320 may be brought into contact with one portion of a lower surface of the upper layer 308'-2 of the conductive line 308' and a flank surface of the intermediate layer 308'-3. That is, the conductive line 308', as described above, is configured to be formed from the triple layer of titanium (Ti), aluminum (Al), and titanium (Ti). In this case, due to the difference in the etching rate of the anode etchant, the aluminum Al positioned in the middle is etched much more, and thus the conductive line 308' has the structure in which the aluminum void is formed. Due to the taper of the bump pattern, the dielectric layer 305 is inclined. Due to the inclined dielectric layer 305, both end portions of the second portion 308'*b* of the conductive line 308' are raised at a predetermined angle toward the upward direction. With the above-described structure of the conductive line 308', the encapsulation layer 320 covering the conductive line 308' prevents the seam from occurring in a flank surface of the conductive line 308'. Thus, the encapsulation layer 320 can have the improved step coverage.

The conductive line 308' may be formed of the same material as the source and drain electrodes 108 of the thin film transistor in the active area A/A, in such a manner as to have the same stacked structure as the source and drain electrodes 108 thereof.

The bump pattern 324 may be formed of the same material as at least one of the semiconductor layer 102 and the gate electrode 104 of the thin film transistor. The aspects of the present disclosure are described in detail above with reference to the accompanying drawings. However, the prevent disclosure is not necessarily limited to the aspects. Various modifications to the aspects are possibly implemented within the scope of the technical idea of the present disclosure. Therefore, the aspects disclosed in the present specification are for describing the technical idea of the present disclosure, rather than limiting it, and do not impose any limitation on the scope of the technical idea of the present disclosure.

Features of various aspects of the present disclosure may be integrated or combined severally or as a whole. It is apparent to a person of ordinary skill that various interworking operations or driving operations are possible. The aspects may be implemented independent of each other or may be implemented in conjunction with each other. Accordingly, the scope of the present disclosure should be defined by the following claims. All equivalent technical ideas that fall within the proper scope should be interpreted to be included within the scope of the present disclosure.

What is claimed is:

1. An organic light-emitting display device comprising:
    a board including an active area and an inactive area adjacent to the active area and including a pad area and a curved portion between the pad area and the active area;
    a pad disposed in the pad area and into which a signal or power is input;
    a conductive line disposed on the board and connected to the pad and along which the power is transferred to the active area; and
    an encapsulation layer disposed on the conductive line,
    wherein the conductive line is formed to have an embossed structure in a plan view between the active area and the curved portion,
    wherein the direction from the active area to the curved portion is a first direction, and the embossed structure protrudes in a second direction intersecting the first direction,
    wherein the conductive line comprises a main portion extended in the first direction, and the embossed structure,
    wherein the embossed structure comprises a first portion including a curved shape, and a second portion disposed between the first portion and the main portion, and
    wherein a width of the first portion in the first direction is greater than the width of the second portion in the first direction.

2. The organic light-emitting display device according to claim 1, wherein the conductive line comprises:
    a lower layer contacting the board;
    an upper layer disposed on the lower layer; and
    an intermediate layer disposed between the upper layer and the lower layer.

3. The organic light-emitting display device according to claim 2, wherein the lower layer comprises titanium (Ti), the intermediate layer comprises aluminum (Al), and the upper layer comprises titanium (Ti).

4. The organic light-emitting display device according to claim 2, wherein a width of the intermediate layer is smaller than the widths of the upper layer and the lower layer.

5. The organic light-emitting display device according to claim 4, wherein the width of the upper layer is greater than the width of the intermediate layer and is smaller than the width of the lower layer.

6. The organic light-emitting display device according to claim 2, wherein an end of the conductive line is distanced from the board more than a middle portion of the second portion.

7. The organic light-emitting display device according to claim 2, wherein an end of the conductive line is raised or lowered at a predetermined angle toward the upward direction.

8. The organic light-emitting display device according to claim 2, wherein the encapsulation layer contacts a lower surface of the upper layer and side surface of the intermediate layer.

9. The organic light-emitting display device according to claim 1, wherein both ends of the conductive line is inclined with respect to the board.

10. The organic light-emitting display device according to claim 1, further comprising:
    a dielectric layer disposed between the board and the conductive line;
    a bump pattern disposed between the board and the dielectric layer and having a positive taper that is inclined toward a direction of the conductive line.

11. The organic light-emitting display device according to claim 10, wherein an angle of a taper of the bump pattern is equal to or greater than 10° and is equal to or smaller than 60°.

12. The organic light-emitting display device according to claim 10, further comprising:
    a thin film transistor disposed in the active area;
    an organic light-emitting element disposed on the thin film transistor and electrically connected to the thin film transistor; and
    wherein the encapsulation layer covers the organic light-emitting element.

13. The organic light-emitting display device according to claim 12, wherein the conductive line is formed of a same material as source and drain electrodes of the thin film transistor.

14. The organic light-emitting display device according to claim 12, wherein the bump pattern prevents a crack in the encapsulation layer from occurring due to different heights of an end of the conductive line.

15. The organic light-emitting display device according to claim 14, wherein the bump pattern is formed of a same material as at least one of a semiconductor layer and a gate electrode of the thin film transistor.

16. The organic light-emitting display device according to claim 1, wherein the conductive line is at least one of a low-level power (VSS) wiring line, a high-level power (VDD) wiring line, and an initialization power (VINI) wiring line.

17. The organic light-emitting display device according to claim 1, wherein the embossed structure is disposed along both side ends of the conductive line such that a path for water permeation along the ends of the conductive line is lengthened.

* * * * *